United States Patent [19]

Nishizawa et al.

[11] Patent Number: 4,673,961
[45] Date of Patent: Jun. 16, 1987

[54] PRESSURIZED CONTACT TYPE DOUBLE GATE STATIC INDUCTION THYRISTOR

[75] Inventors: Jun-ichi Nishizawa, Miyagi; Hisao Kondoh, Osaka, both of Japan

[73] Assignee: Research Development, Corporation of Japan, Tokyo, Japan

[21] Appl. No.: 839,106

[22] Filed: Mar. 13, 1986

[30] Foreign Application Priority Data

Mar. 13, 1985 [JP] Japan ................................ 60-50056

[51] Int. Cl.⁴ .......................................... H01L 29/80
[52] U.S. Cl. ..................................... 357/22; 357/38; 357/56; 357/72; 357/74; 357/79; 357/81
[58] Field of Search ...................... 357/22, 38, 56, 72, 357/74, 79, 81

[56] References Cited

U.S. PATENT DOCUMENTS 4,402,004  8/1983  Iwasaki ................................. 357/79

Primary Examiner—Joseph E. Clawson, Jr.
Attorney, Agent, or Firm—Kerkam, Stowell, Kondracki & Clarke

[57] ABSTRACT

A pressurized contact type double gate static induction thyristor comprising a semiconductor body located in a casing and having cathode electrodes and a first gate electrode at one principal surface side thereof and anode electrodes and a second gate electrode at the other principal surface side thereof. A first thermal expansion stress buffer plate is located in the casing to be in contact with the cathode electrode, and a second thermal expansion stress buffer plate is located at the other principal surface side of the semiconductor body. This second plate is composed of at least two metal members electrically insulated from each other and integrally bonded by an insulating material, one of the two metal members being in contact with the anode electrode and the other metal member being in contact with the second gate electrode.

12 Claims, 13 Drawing Figures

PRESSURIZED CONTACT TYPE DOUBLE GATE STATIC INDUCTION THYRISTOR

BACKGROUND OF THE INVENTIONS

1. Field of the Invention

The present invention relates to a power semiconductor switching device, and particularly to a pressurized contact type double gate static induction thyristor.

2. Description of the Related Art

Power semiconductor switching devices are required to permit the flow of as heavy current as several thousand amperes when turning on at power line and to withstand as high voltage as several thousand volts when turning off at power line. In an attempt to meet such strict requirements in power switching application to power line, a variety of semiconductor configurations have been hitherto proposed, and among these proposals a pressurized contact type power semiconductor switching device is the most attractive one. Gate turnoff thyristors, transistors and diodes of the pressurized contact configuration are disclosed, for instance, in Japanese Patent Publn. Nos. 59-29143 and 59-50114.

FIG. 5 shows, in section, a pressurized contact type gate turnoff thyristor. In the drawing, an NPNP lamination body composed of semiconductor layers of different conductivity types is designated at Reference Numeral 100. The NPNP lamination body 100 has a number of cathode projection areas 51 formed an the top surface of the lamination body. An underlying layer of p-type 52 constitutes a gate area and under the p-type layer 52 there is an n-type layer whose bottom is contiguous to a lowermost layer of p-type 53 which constitutes an anode area. Each cathode projection area 51 has a cathode electrode 54 formed thereon. Likewise, the gate area 52 has a gate electrode 55 formed thereon and the anode area 53 has an anode electrode 56 formed thereon. A first thermal expansion stress buffer plate 57 is contacted to the anode electrode 56, and the NPNP lamination body 100 is covered at its peripheral side surface with an insulating resin coating 58. A second thermal expansion stress buffer plate 59 is located on the cathode electrode 54.

The above mentioned structure is contained in a hermatically sealed housing 200 which is composed of an insulating cylinder 60 of ceramic or other insulating material. This insulating cylinder 60 is closed at its top by a cover plate 62 which is secured at its outer periphery at the top end of the cylinder 60. This cover plate 62 supports at its center a cooled cathode electrode 61 in contact to the stress buffer plate 59. Further, the insulating cylinder 60 is closed at its bottom by a flexible cover plate 64 whose outer periphery is fixed to the lower end of the cylinder 60. This cover plate 64 is provided at its center with a cooled anode electrode 63 which is forcedly contacted to the stress buffer plate 57. The cylinder 60 is also provided with a gate electrode connection sleeve 65 which is connected through lead wires 66 to the gate electrode 55. These lead wires 66 are bonded in the conventional method.

The first thermal expansion stress buffer plate 57 is made of a metal whose thermal expansion coefficient is matched to be substantially equal to the thermal expansion coefficient of the semiconductor material of the lamination body 100. Molybdenum or tungsten is used if the semiconductor is silicon. In general, a circular NPNP lamination body is soldered to a first circular, stress buffer plate 57 with aluminum. The circular lamination body 100 has a diameter smaller than the diameter of the circular stress buffer plate 57. As shown, the circumference of the circular lamination body 100 is chamfered to form angles $\theta_1$ and $\theta_2$ with respect to the bottom of the body. These chamferings have a great influence on the withstand voltage of the gate turnoff thyristor. Therefore, the circumference of the lamination body is coated with the resin material 58 because a surface discharge would otherwise appear on the lamination body when several thousand voltage is applied across the semiconductor device.

In the pressurized contact configuration as shown, the cooled electrode 61, the second thermal expansion stress buffer 59 and the cathode electrode 54 are slidably contact with each other. Likewise, the first thermal expansion stress buffer plate 57 and the cooled anode electrode 63 are slidably contact with each other. If a stress is generated by the difference between the thermal expansion coefficient of the semiconductor material and that of the cooled electrode when an electric current of several thousand amperes flows in the semiconductor device to raise its temperature, the slidable contact is effective to prevent such stress from applying to the NPNP lamination body 100 of the semiconductor device. In order to reduce the electric resistance at the slidable contact regions of the semiconductor device prior to the flow of a heavy current, a force ranging from several hundred kilograms to several tons is applied to the semiconductor device in the direction as indicated by the arrows in FIG. 5. Then, the first thermal expansion stress buffer plate 57 is effective to prevent the lamination body 100 from being destroyed, and at the same time is effective to protect the circumference of the lamination body 100.

In the pressurized contact configuration as described above, the semiconductor lamination body 100 needs to be fixed to the thermal expansion stress buffer plate by soldering. In the gate turnoff thyristor, only the anode 53 of the lamination structure needs to be fixed to the thermal expansion stress buffer plates, which may be made of single metal plate.

Compared with the conventional gate turnoff structure as described above, a double gate static induction thyristor has a complicated structure. In other words, two different electrodes, i.e. anode and second gate electrodes are formed on one side of the thyristor structure to which a thermal expansion stress buffer plate needs to be fixed. Therefore, the conventional pressurized contact structure cannot be applied as it is to the double gate static induction thyristor. Because of this, the double gate static induction thyristor have not been widely used in practice, although they have been recognized to be more excellent than the conventional gate turn off thyristors.

SUMMARY OF THE INVENTION

Accordingly, it is one object of the present invention to provide a pressurized contact type double gate static induction thyristor for heavy power.

Another object of the present invention is to provide an improved structure of a pressurized contact type double gate static induction thyristor facilitating a hermetical encapsulation of the thyristor body.

The above and other objects of the present invention are achieved in accordance with the present invention by a pressurized contact type double gate static induction thyristor which includes, as a thermal expansion stress buffer plate, a metal-and-insulation composite plate having a number of metal pieces electrically isolated from each other by insulation material, and brought into contact with corresponding electrodes of one principal surface of the semiconductor lamination body. The composite plate is large enough to cover the above principal surface of the semiconductor lamination body, thereby defining a hermetically sealing for the one principal surface of the semiconductor body.

Specifically, the pressurized contact type double gate static induction thyristor in accordance with the present invention comprising: a hermetical casing; a semiconductor lamination body composed of layers of different conductivity types and contained in the casing; a first gate region formed on one principal surface of the lamination body; discrete cathode regions rising from the level at which the first gate region is laid; a second gate region formed on the other principal surface of the lamination body; discrete anode regions rising from the level at which the second gate region is laid; a first thermal expansion stress buffer plate laid on the discrete cathode regions; a second thermal expansion stress buffer plate laid on and fixed to the second gate and discrete anode regions; a cooled cathode electrode laid on the first thermal expansion stress buffer plate; and a cooled anode electrode laid on the second thermal expansion stress buffer plate, the second thermal expansion stress buffer plate being composed of a metal-and-insulation composite plate which includes a circular metal member, an annular metal projection and a surounding metal plate electrically insulated from each other and integrally bonded by insulating material, the annular projections and the circular metal member being in contact with the second gate regions and the discrete anode regions, respectively.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
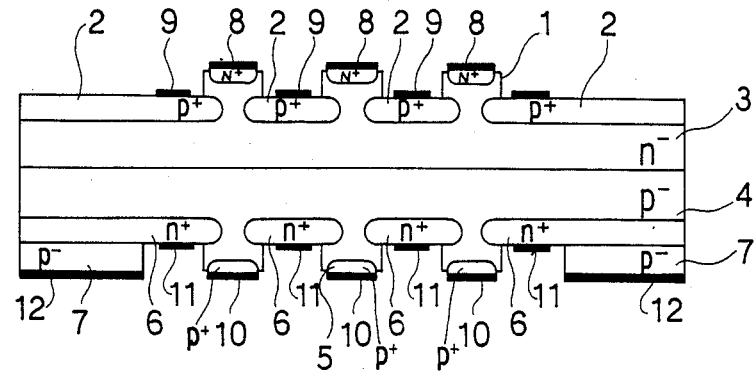
FIG. 1A shows diagrmmatically the semiconductor lamination structure of a double gate static induction thyristor.
Figure 1B:
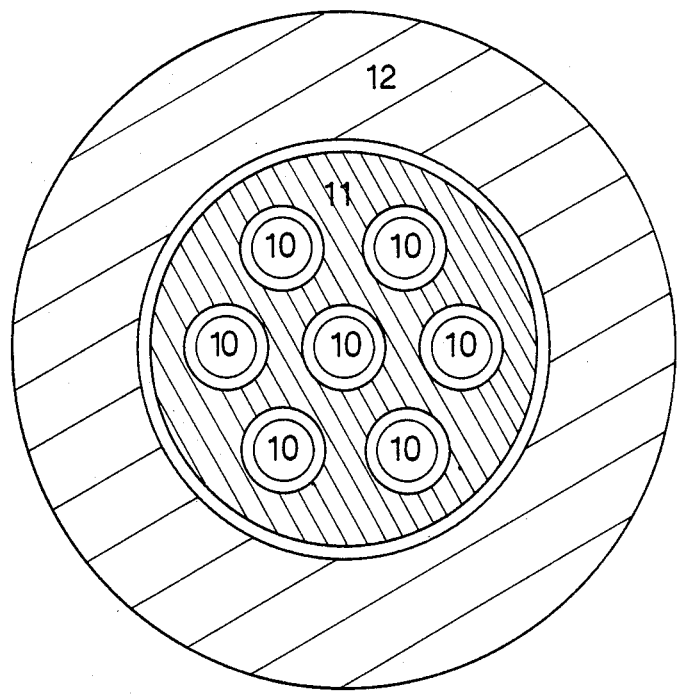
FIG. 1B shows diagrammatically the semiconductor lamination structure as seen from the bottom side of the structure.

FIG. 1A is a sectional view showing structure of a static induction thyristor body of the double gate type having gate electrodes formed on the opposite surfaces thereof according to the present invention, whereas FIG. 1B is a plane view of the thyristor body as seen from the anode side of the thyristor.

The shown thyristor is separated into an upper part and a lower part by a center p-n junction. The upper part includes a lightly doped n-type semiconductor layer 3 made of for example silicon, which is contiguous to a lightly doped p-type silicon layer 4 of the lower part to form the p-n junction therebetween. The semiconductor layer 3 has a heavily doped p-type gate region 2 selectively formed in an upper principal surface thereof. A plurality of lightly doped n-type regions are further formed on the upper portion of the layer 3 on which the gate region 2 is not formed, and these regions are heavily doped at their top surface regions with n-type impurities such as phosphorus so as to have cathode regions 8. On the other hand, the silicon layer 4 has a heavily doped n-type gate region 6 selectively formed in its lower principal surface. A number of lightly doped p-type regions are also formed on the lower portion of the layer 4 on which the gate region 6 is not formed, and these p-type regions have their top surface regions heavily doped with p-type impurities such as borons so as to form anaode regions 5. Further, a lightly doped p-type annular region 7 is formed on a peripheral portion of the gate region 6 so as to surround all the anode regions 5. In addition, cathode electrodes 8, a first gate electrode 9, anode electrodes 10, second gate electrodes 11, and metal coating 12 are deposited on the cathode regions 1, the first gate region 2, the anode regions 5, the second gate region 6, and the semiconductor region 7, respectively.

FIG. 1A shows one example of the thyristor body whose projecting anode is to be soldered to a thermal expansion stress buffer plate (See FIG. 2). What is to be noted here is that: the annular bottom circumferential portion 7 encircling the projecting anode regions 5 is at the same level as these anode regions 5; and the annular bottom surface is coated with a metal as designated at 12.

As seen in FIG. 1B, the metal pattern on the anode side of the semiconductor lamination body is in the form of concentric circles. The anode piece electrodes 10 and the second gate electrode 11 are formed in the central circle, and the metal coating 12 is formed in the surrounding annular area.

Figure 2A:
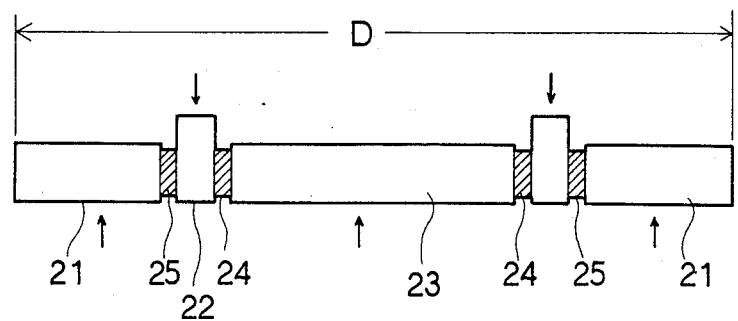
FIGS. 2A and 2B show diagrammatically, in section and in plane respectively, a thermal expansion stress buffer plate to be applied to the anode side of the semiconductor lamination body.
Figure 2B:
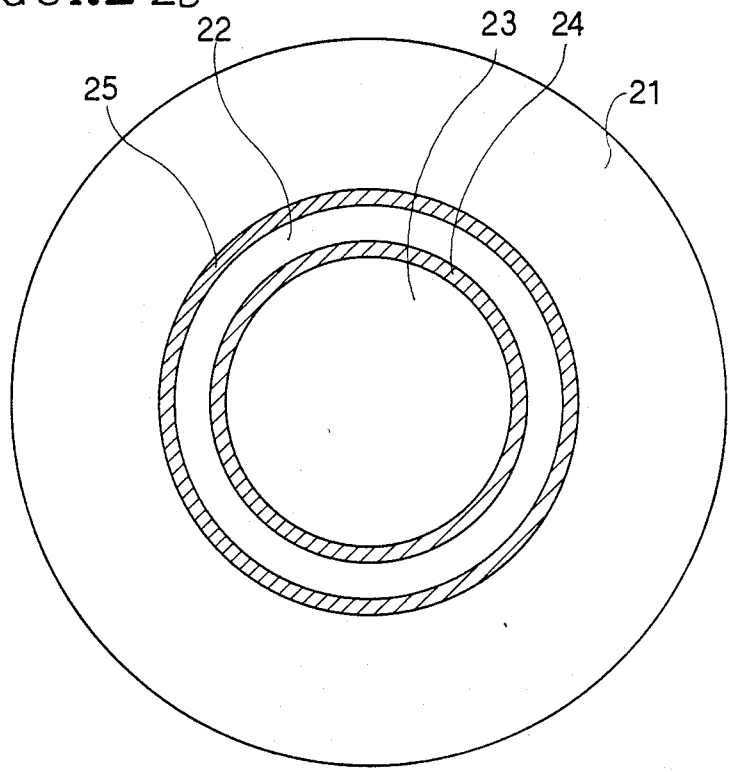

FIG. 2 shows one example of the thermal expansion stress buffer plate to be fixed to the anode side of the semiconductor lamination body of a pressurized contact type double gate static induction thyristor. Specifically, Fig. 2A is a sectional side view of the thermal expansion stress buffer plate whereas FIG. 2B is a plane view of the thermal expansion stress buffer plate.

In these drawings, the buffer plate includes two annular metals 21 and 22 and a circular metal 23 which are in concentric relation and are insulated from each other by annular electric insulations 24 and 25. The outer annular metal 21 taken a roll of protecting the electrostatic induction thyristor, and in this connection, the diameter of the annular metal 21 is larger than the diameter of the thyristor. The inner annular metal 22 is designed to be in contact with the seocnd gate electrode 11 (FIGS. 1A and 1B) when assembled, and the center circular metal 23 is designed to be in contact with the anode electrodes 10 (See FIGS. 1A and 1B). The side of the thermal expansion stress buffer plate to be brought in contact with the thyristor structure may be recessed at selected areas corresponding to the projecting anode areas 5 (See FIG. 1A).

The annular electric insulations 24 and 25 serve not only to electrically isolate the annular and circular metals 21, 22 and 23 from each other, and but also to hold them mechanically. These metal and insulator members should have a mechanical strength enough to prevent any deformation of the thermal expansion stress buffer plate when as strong a force as 20 kilograms is applied thereto in the direction indicated by arrows as shown in FIG. 2A. The electric insulation members need to have as high a withstand voltage as 500 volts. Also, it is required that the electric insulator members 24 and 25 shows no sign of deterioration in their mechanical and electrical characteristics when heated at the temperature of 600° C. for 30 minutes in vacuum, and that they cannot be eroded by acid and alkaline chemicals. Preferably, the electric insulator and metal members are airtightly bonded to constitute an integral thermal expansion stress buffer plate, so that the anode side of the semiconductor body is hermetically protected by the stress buffer plate.

Referring to FIGS. 3A to 3G, the process of a pressurized contact type double gate static induction thyristor according to the present invention is described below.

Figure 3A:
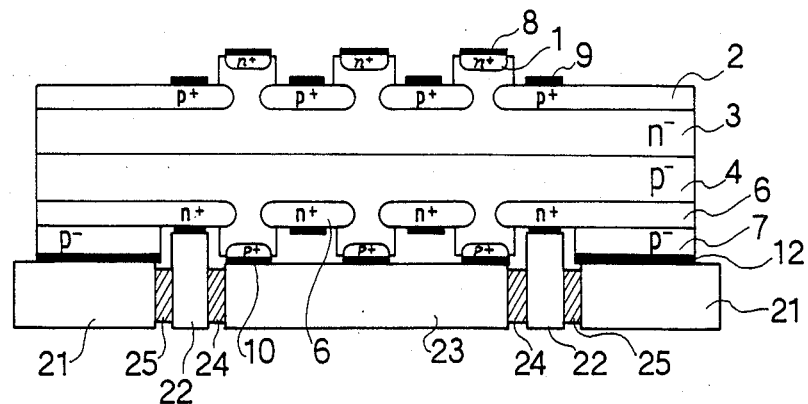
FIGS. 3A to 3G show how a pressurized contact type double gate static induction thyristor is assembled according to the present invention.
Figure 3B:
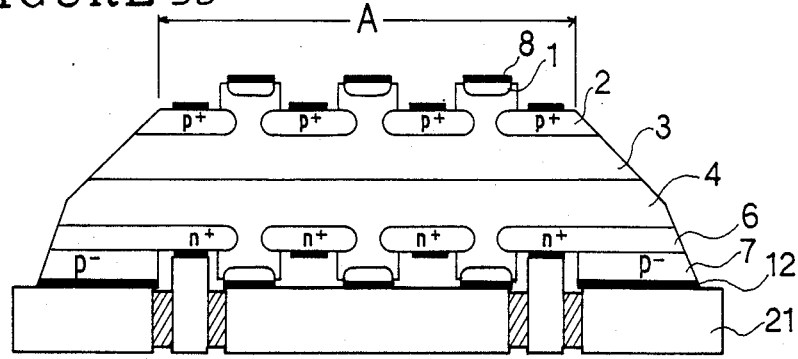
Figure 3C:
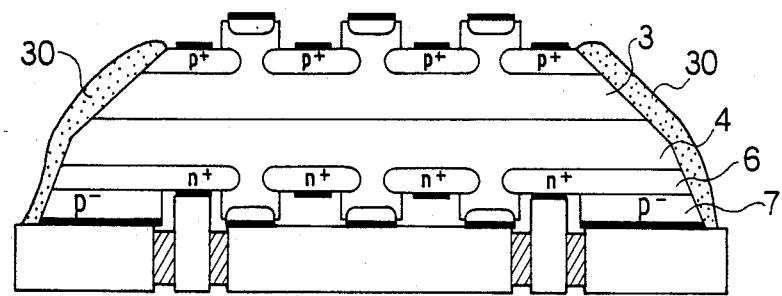
Figure 3D:
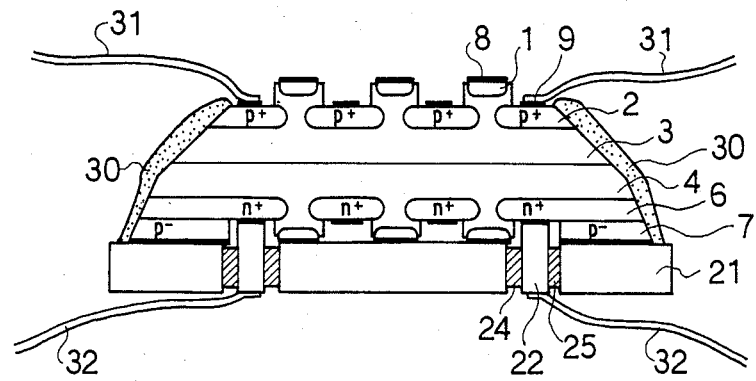
Figure 3E:
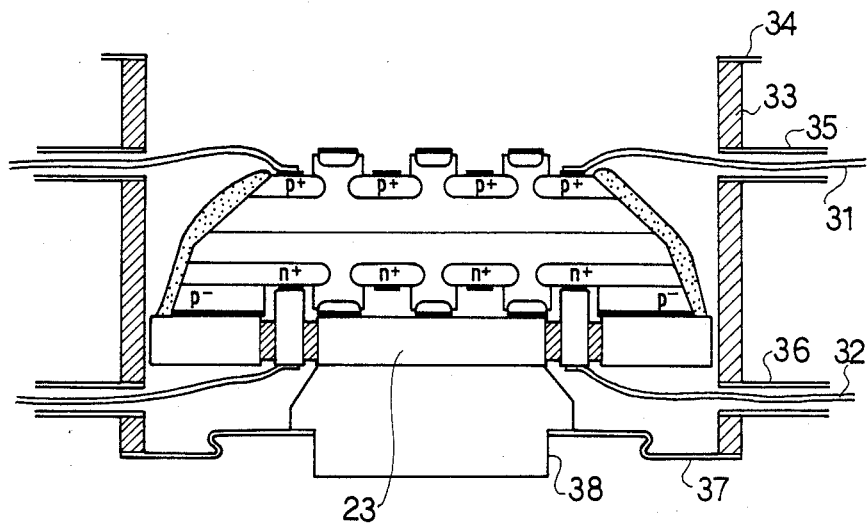

First, as shown in FIG. 3A, a thermal expansion stress buffer plate of FIG. 2 is fixed to the anode side of the thyristor structure of FIG. 1 by soldering with aluminum or any other appropriate metal. Next, as shown in FIG. 3B, the circumference of the thyristor structure is chamfered at desired angles, and then these chamfers are chemically etched about 10 micrometers. Then, the part designated at "A" is covered with resin or any other appropriate material lest the part should be damaged. The remaining resin, abradant and etching liquid are removed by washing, and then the semi-finished product is dried. As shown in FIG. 3C, the etched side surface of the thyristor structure is covered with an insulating resin or rubber 30, thereby preventing the appearance of surface discharge therealong. As shown in FIG. 3D, lead wires 31 and 32 are connected to the first gate electrode 9 and the annular metal 22 by supersonic bonding, respectively. Then, the semi-finished product is put in an airtight capsule as shown in FIG. 3E.

Figure 3F:
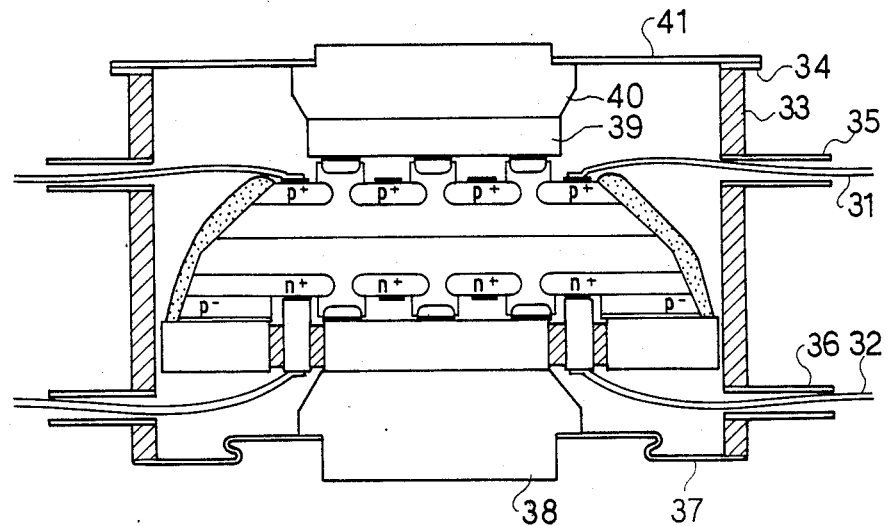
Figure 3G:
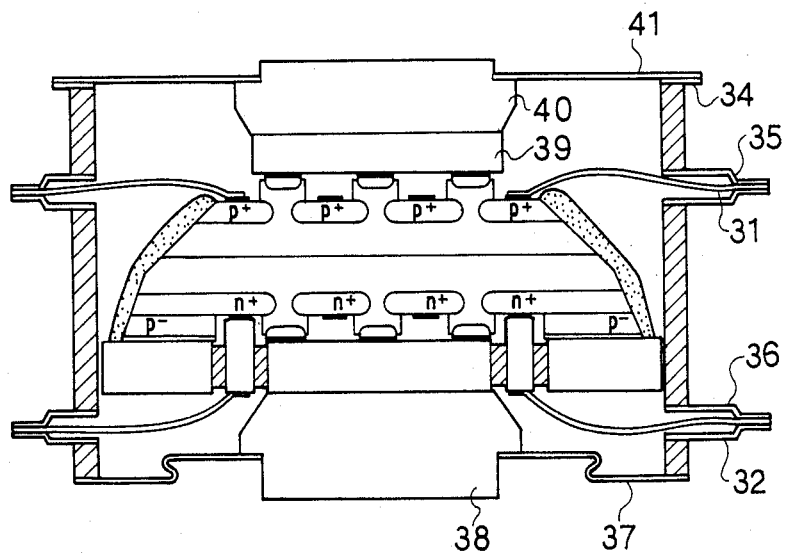

In the drawing, the capsule has a ceramic hollow cylinder 33 provided at its top end a welding flange 34. The cylinder 33 also includes first sleeves 35 for taking out the lead wire 31 extending from the first gate, second sleeves 36 for taking out the lead wire 32 extending from the second gate, a flexible cover 37 fixed to the bottom end thereof so as to close its bottom opening, and a cooled anode electrode 38 supored by the cover 37. The ceramic hollow cylinder 33, the welding flange 34, the sleeves 35, 36, the flexible cover 37, and the anode cooled electrode 38 are hermetically connected with each other. In this condition, the center metal 23 is laid on the cooled anode electrode 38 in electrically contact thereto. Next, as shown in FIG. 3F, a second thermal expansion stress buffer plate 39 is put on the cathode electrode 8, and then, a cooled cathode electrode 40 airtightly supported by a cover palte 41 is put on the second buffer plate 39 so as to close a top opening of the cylinder 33.

Thereafter, the welding flange 34 and the cover plate 41 are integrally connected to each other by electric welding. Then, the air within the capsule is replaced by dry nitrogen, and the sleeves 35 and 36 are closed and hermetically sealed.

Figure 4:
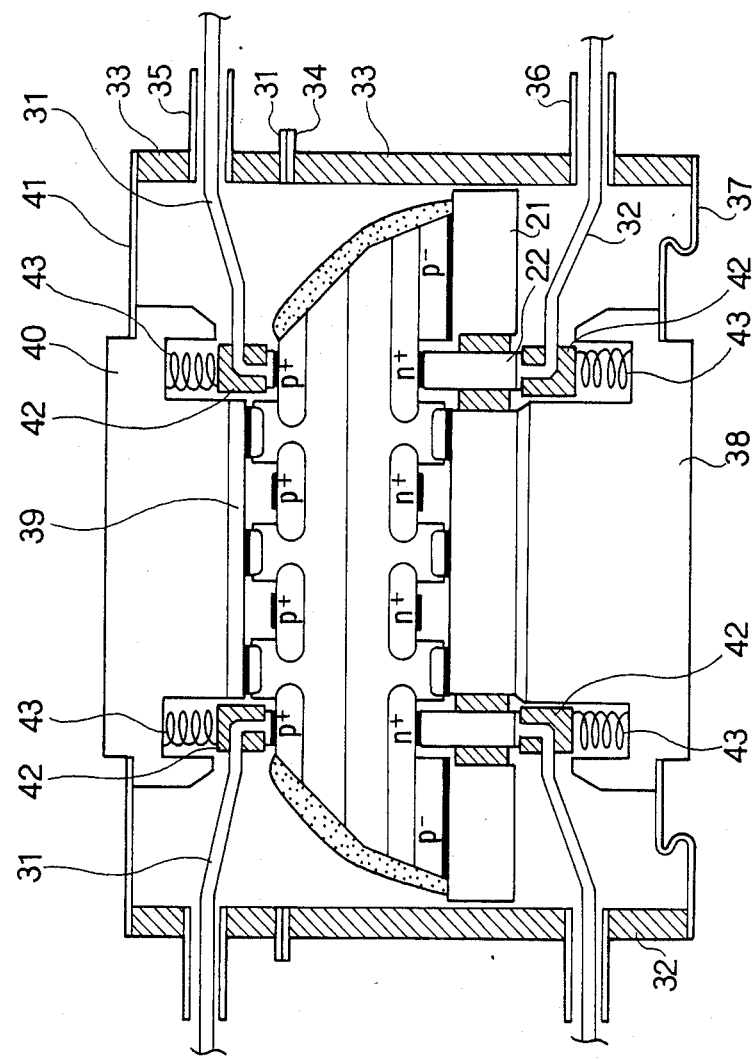
FIG. 4 shows diagrammatically another embodiment of the pressurized contact type double gate static induction thyristor according to the present invention.
Figure 5:
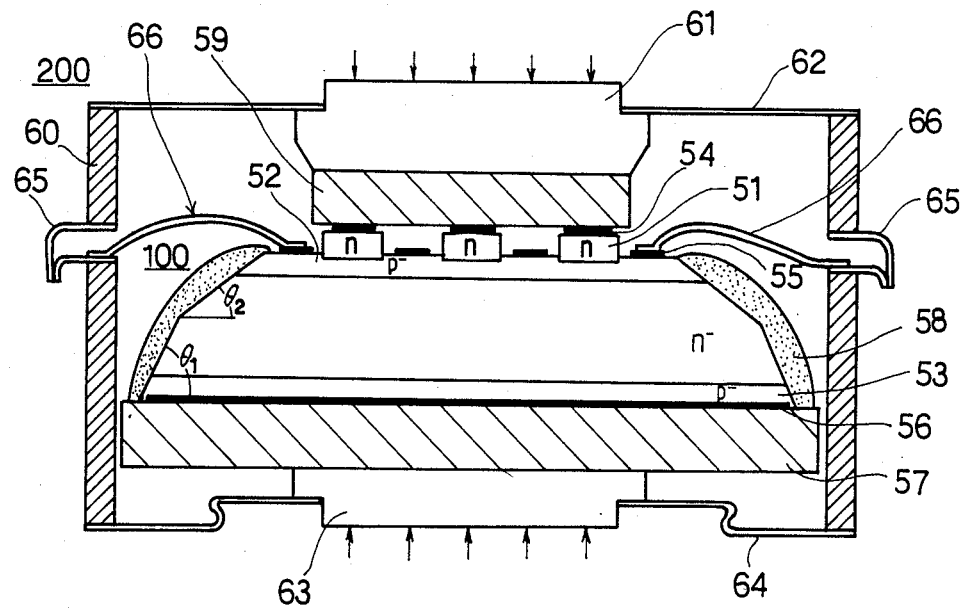
FIG. 5 shows diagrammatically a conventional presurized contact type gate turnoff thyristor.

FIG. 4 shows another embodiment of the pressurized contact type double gate static induction thyristor according to the present invention. In this particular embodiment, one end of each lead wire 32 is not bonded to the annular metal 22 of the thermal expansion stress buffer plate, but it is pushed against the annular metal 22 through the agency of a ceramic insulator 42 by means of a coil spring 43 based on the cooled electrode 38. In a similar manner, one end of each lead wire 31 is applied to the first gate electrode. Also, is should be noted that the gas-filled capsule is composed of upper and lower cylindrical halves which can be separated from each other at their welding flanges 34. This separate configuration facilitates hermetical encapsulation of a pressurized contact type double gate induction thyristor.

As seen from the above explanation of the embodiments with reference to the accompanying drawing, the thermal expansion stress buffer plate composed of a metal-and insulation composite plate facilitates assemble of a pressurized contact type double gate static induction power thyristor.

The invention has thus been shown and described with reference to specific embodiments. However, it should be noted that the invention is in no way limited to the details of the illustrated structures but changes and modifications may be made within the scope of the appended claims.

What is claimed is:

1. A pressurized contact type double gate static induction thyristor comprising:
    a casing;
    a semiconductor body located in the casing and having cathode electrodes and a first gate electrode at one principal surface side thereof and anode electrodes and a second gate electrode at the other principal surface side thereof;
    a first thermal expansion stress buffer plate located in the casing to be in contact with the cathode electrodes; and
    a second thermal expansion stress buffer plate located in the casing and composed of at least two metal members electrically insulated from each other and integrally bonded by an insulating material, one of the two metal members being in contact with the anode electrodes and the other metal member being in contact with the second gate electrode.

2. A thyristor as claimed in claim 1 wherein the anode electrodes project at a level higher than the level on which the second gate electrode is laid, and wherein the second metal member of the second thermal expansion stress buffer plate projects from the level of the first metal member so as to directly contact the second gate electrode.

3. A thyristor as claimed in claim 1 wherein the second gate electrode is formed in the form of a circle on the other principal surface of the semiconductor body and the anode electrodes are formed in the area of the circular second gate electrode to project from the second gate electrode, and wherein the second thermal expansion stress buffer plate comprises a circular metal plate brought into contact with all the anode electrodes and a first annular metal plate surrounding the circular metal plate through the intermediary of an annular insulating member, the annular metal plate being contacted with a peripheral portion of the circular second gate electrode.

4. A thyristor as claimed in claim 3 wherein the semiconductor body has an annular peripheral semiconductor region formed on the other principal surface thereof to surround the anode electrodes and to project at substantially the same level as that of the anode electrodes, and wherein the second thermal expansion stress buffer plate further includes a second annular metal member surrounding the first annular metal plate through another insulating member and being contacted to the peripheral semiconductor region of the other principal surface.

5. A thyristor as claimed in claim 3 wherein the casing comprises a ceramic cylinder accommodating the semiconductor body and having two opposite openings, a first cover fixed to close one of the two openings of the cylinder, a cooled cathode electrode supported at a center of the first cover and contacted to the cathode eletrodes of the semiconductor body through the first thermal expansion stress buffer plate, a second cover fixed to close the other opening of the cylinder, and a cooled anode electrode flexibly supported at a center of the second cover and contacted to the circular metal plate of the second thermal expansion stress buffer plate.

6. A thyristor as claimed in claim 5 wherein lead wires are bonded to the first gate electrode and the first annular metal member of the second thermal expansion stress buffer plate, respectively, and are extended to taking-out sleeves formed in the ceramic cylinder.

7. A thyristor as claimed in claim 5 wherein lead wires are forcedly contacted to the first gate electrode and the first annular metal member of the second thermal expansion stress buffer plate, respectively through an insulating support by spring means based on the respective cooled electrodes.

8. A thyristor as claimed in claim 5 wherein the casing is composed of two separate halves with their flanges welded together, and lead wires are pushed at their one end against the first gate electrode and the first annular metal number by associated spring means through the agency of an intervenient insulator.

9. A thyristor as claimed in claim 3 wherein the metal member of the second thermal expansion stress buffer plate is made of a metal whose thermal expansion coefficient is matched to be substantially equal to that of the semiconductor material, and the insulating member is made of a material which has a resistance both to heat and chemicals.

10. A pressurized contact type double gate static induction thyristor comprising:
   a hermetical casing;
   a semiconductor lamination body composed of layers of different conductivity types contained in the casing;
   a first gate region formed on one principal surface of the lamination body;
   discrete cathode regions rising from the level at which the first gate region is laid;
   a second gate region formed on the other principal surface of the lamination body;
   discrete anode regions rising from the level at which the second gate region is laid;
   a first thermal expansion stress buffer plate laid on the discrete cathode regions;
   a second thermal expansion stress buffer plate laid on and fixed to the second gate and discrete anode regions;
   a cooled cathode electrode laid on the first thermal expansion stress buffer plate; and
   a cooled anode electrode laid on the second thermal expansion stress buffer plate,
   the second thermal expansion stress buffer plate being composed of a metal-and-insulation composite plate comprising a circular metal member, an annular metal projection and a surrounding metal plate electrically insulated from each other and integrally bonded by insulating material, the annular metal projections and said circular metal member being in contact with the second gate regions and the discrete anode regions, respectively.

11. A thyristor as claimed in claim 10 wherein the metal projections and said circular metal member are made of a metal whose thermal expansion coefficient is matched to be substantially equal to that of the semiconductor material, and the insulating material is made of a material which has a resistance both to heat and chemicals.

12. A thyristor as claimed in claim 10 wherein the hermetical casing is composed of two separate halves with their franges welded together, and lead wires are pushed at their one end against a selected region by an associated spring means through the agency of an intervenient insulator.

* * * * *